(12) United States Patent
Sekine et al.

(10) Patent No.: US 9,457,421 B2
(45) Date of Patent: Oct. 4, 2016

(54) WIRE-BONDING APPARATUS AND METHOD OF WIRE BONDING

(71) Applicant: SHINKAWA LTD., Tokyo (JP)

(72) Inventors: Naoki Sekine, Tokyo (JP); Motoki Nakazawa, Tokyo (JP); Yong Du, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/712,927

(22) Filed: May 15, 2015

(65) Prior Publication Data

US 2015/0246411 A1 Sep. 3, 2015

Related U.S. Application Data

(63) Continuation of application No. PCT/JP2013/080501, filed on Nov. 12, 2013.

(30) Foreign Application Priority Data

Nov. 16, 2012 (JP) .................................. 2012-252226

(51) Int. Cl.
*B23K 31/02* (2006.01)
*B23K 20/00* (2006.01)
(Continued)

(52) U.S. Cl.
CPC ............ *B23K 20/007* (2013.01); *B23K 20/004* (2013.01); *B23K 20/005* (2013.01); *B23K 20/10* (2013.01); *H01L 24/78* (2013.01); *H01L 24/85* (2013.01); *H01L 24/45* (2013.01); *H01L 24/48* (2013.01); *H01L 2224/45015* (2013.01); *H01L 2224/45124* (2013.01);
(Continued)

(58) Field of Classification Search
None
See application file for complete search history.

(56) References Cited

U.S. PATENT DOCUMENTS

| | | | |
|---|---|---|---|
| 4,422,568 A | 12/1983 | Elles et al. | |
| 4,523,071 A * | 6/1985 | Bancroft | B23K 20/007 219/130.4 |

(Continued)

FOREIGN PATENT DOCUMENTS

| | | |
|---|---|---|
| JP | 55-7415 | 1/1980 |
| JP | 58-9332 | 1/1983 |

(Continued)

OTHER PUBLICATIONS

"International Preliminary Report on Patentability of PCT/JP2013/080501", completed on Mar. 2, 2015, by JPO, with English translation thereof, pp. 1-7, in which two of the listed references (JP2006-186087 and JP2007-180349) were cited.

(Continued)

*Primary Examiner* — Kiley Stoner
(74) *Attorney, Agent, or Firm* — Jianq Chyun IP Office

(57) ABSTRACT

Provided is a wire-bonding apparatus 10 including a capillary 28 through which a wire 30 is inserted, a nonsticking determination circuit 36, and a controller 80. The nonsticking determination circuit 36 applies a predetermined alternating-current electrical signal between the wire held by the capillary and the bonding target, obtains a capacitance value between the wire held by the capillary and the bonding target, determines that the wire is disconnected from the bonding target when the capacitance value decreases after the first bonding operation, and determines that the disconnected wire drops down and is brought into contact with the bonding target when the capacitance value returns to an original value before reaching the second bonding point.

9 Claims, 6 Drawing Sheets

(51) Int. Cl.
*H01L 23/00* (2006.01)
*B23K 20/10* (2006.01)

(52) U.S. Cl.
CPC ............... *H01L 2224/45144* (2013.01); *H01L 2224/48091* (2013.01); *H01L 2224/48472* (2013.01); *H01L 2224/789* (2013.01); *H01L 2224/78301* (2013.01); *H01L 2224/78343* (2013.01); *H01L 2224/78349* (2013.01); *H01L 2224/859* (2013.01); *H01L 2224/85186* (2013.01); *H01L 2224/85205* (2013.01); *H01L 2224/85986* (2013.01); *H01L 2924/3011* (2013.01)

(56) References Cited

U.S. PATENT DOCUMENTS

| | | | | |
|---|---|---|---|---|
| 4,586,642 A * | 5/1986 | Dreibelbis | ........... | B23K 20/007 228/104 |
| 5,238,173 A * | 8/1993 | Ura | ............... | B23K 20/007 228/104 |
| 5,323,952 A * | 6/1994 | Kato | ............... | B23K 20/10 228/102 |
| 5,326,015 A * | 7/1994 | Weaver | ............... | B23K 20/007 228/102 |
| 5,459,672 A * | 10/1995 | Cawelti | ............... | B23K 20/10 228/1.1 |
| 5,591,920 A * | 1/1997 | Price | ............... | B23K 31/125 228/4.5 |
| 5,645,210 A * | 7/1997 | Toner | ............... | B23K 20/10 228/1.1 |
| 6,039,234 A * | 3/2000 | Toner | ............... | B23K 20/004 228/102 |
| 6,117,693 A * | 9/2000 | Fogal | ............... | G01R 31/2853 228/180.5 |
| 6,853,202 B1 * | 2/2005 | Chang | ............... | G01R 31/2853 324/691 |
| 2002/0053920 A1 * | 5/2002 | Ming-Hsun | ........ | G01R 31/2853 324/762.04 |
| 2002/0130158 A1 * | 9/2002 | Boller | ............... | B23K 20/004 228/103 |
| 2003/0227016 A1 * | 12/2003 | Dacanay | ............... | B23K 20/004 257/48 |
| 2005/0167473 A1 | 8/2005 | Mayer et al. | | |
| 2005/0219777 A1 * | 10/2005 | Sasakura | ............... | B23K 20/007 361/42 |
| 2006/0186839 A1 | 8/2006 | Miyahara et al. | | |
| 2007/0187470 A1 * | 8/2007 | Tei | ............... | B23K 20/004 228/180.5 |
| 2010/0051670 A1 * | 3/2010 | Okafuji | ............... | B23K 20/005 228/102 |
| 2011/0101073 A1 * | 5/2011 | Zhang | ............... | B23K 20/005 228/103 |
| 2013/0180957 A1 * | 7/2013 | Lee | ............... | B23K 20/007 219/69.12 |
| 2014/0246480 A1 * | 9/2014 | Gillotti | ............... | H01L 24/78 228/102 |

FOREIGN PATENT DOCUMENTS

| | | | | |
|---|---|---|---|---|
| JP | 04074448 A | * | 3/1992 | |
| JP | 11-008262 | | 1/1999 | |
| JP | 11-176868 | | 7/1999 | |
| JP | 2000-306940 | | 11/2000 | |
| JP | 3335043 | | 10/2002 | |
| JP | 2006-186087 | | 7/2006 | |
| JP | 2007-180349 | | 7/2007 | |
| JP | 5236221 B2 | * | 7/2013 | ............. H01L 24/78 |
| KR | 20060074825 A | * | 7/2006 | ............. H01L 24/85 |
| KR | 20060129894 A | * | 12/2006 | ............. H01L 24/78 |
| KR | 10-0730046 | | 6/2007 | |
| KR | 10-0841263 | | 6/2008 | |
| TW | 200506392 | | 2/2005 | |
| TW | I337385 | | 2/2011 | |

OTHER PUBLICATIONS

"Office Action of Taiwan Counterpart Application", issued on Sep. 25, 2015, pp. 1-15, with English translation thereof.

* cited by examiner $t=t_4$ $t=c_0$ $t=c_1$ $t=c_2$

WIRE-BONDING APPARATUS AND METHOD OF WIRE BONDING

CROSS REFERENCE TO RELATED APPLICATIONS

This application is a Continuation of PCT International Application No. PCT/JP2013/080501, filed on Nov. 12, 2013, which claims priority under 35 U.S.C §119(a) to Patent Application No. 2012-252226, filed in Japan on Nov. 16, 2012, all of which are hereby expressly incorporated by reference into the present application.

TECHNICAL FIELD

The present invention relates to an apparatus and a method capable of performing wire bonding using a capillary.

BACKGROUND ART

A wire-bonding apparatus is used for connecting between a lead of a substrate and a pad of a chip with a fine wire, for example. The wire bonding is performed in the following manner. Specifically, a wire along with a tool for wire bonding is caused to move down toward a lead. The wire and the tool are first moved down at high speed, and then slowed down when they come closer to the lead. The low-speed lowering at this time is referred to as first searching (1'st searching). Then, the wire is pressed against the lead by a tip of the tool, and the wire and the lead are bonded while ultrasonic vibration is applied. This bonding is referred to as first bonding (1'st bonding). After the first bonding, the tool is moved upward to feed the wire and moved above a pad while forming an appropriate loop. When the tool comes above the pad, the tool is moved down. The wire is first moved down at high speed, and then slowed down when it comes closer to the pad. The low-speed lowering at this time is referred to as second searching (2'nd searching). Then, the wire is pressed against the pad by the tip of the tool, and second bonding (2'nd bonding) is performed by bonding the wire and the pad while ultrasonic vibration is applied. After the second bonding, the tool is moved upward while the movement of the wire is stopped by a wire clamper to cause the wire to be disconnected at the second bonding point. Repeating this, a plurality of leads of a substrate and a plurality of pads of a chip are connected. Here, heating may be performed appropriately during the first bonding and the second bonding. Moreover, the first bonding may be performed to the pads, and the second bonding may be performed to the leads.

As described above, in the wire bonding, two bonding including the first bonding and the second bonding are performed. Unfortunately, however, there is a case in which the first bonding or the second bonding is not normally performed. Further, there may be a case in which, as the first bonding is insufficient, the wire is separated from the lead at the stage of the loop formation before the second bonding. There may also be a case in which the wire is disconnected in the middle of the loop formation even if the first bonding has been normally performed. These phenomena are collectively referred to as nonsticking, and detection of such nonsticking is required to be performed at an early stage. In order to detect nonsticking, a voltage or a current is applied between a side of the substrate and a side of the wire of the tool, and nonsticking is determined based on whether or not a resistance component, a diode component, and a capacitance component between these sides are normal.

Known methods of wire bonding include a ball bonding method and a wedge bonding method.

In the ball bonding method, a gold wire or the like with which a FAB (Free Air Ball) may be formed by high-voltage spark or the like is used, and a capillary having a chamfer portion rotationally symmetric about an axis along a longitudinal direction at its tip is used as a tool.

In the wedge bonding method, an aluminum wire or the like is used and any FAB is formed, and a tool for wedge bonding having a wire feed guide and a pressing surface at its tip is used as a tool for bonding instead of a capillary. In the wedge bonding, at the tip of the tool, the wire is fed along the wire feed guide at an angle on a side of the pressing surface, and a side surface of the wire is pressed against a bonding target with the pressing surface so as to perform bonding. Therefore, the wire projects laterally from the pressing surface by the tip of the tool, and the tip of the tool is not rotationally symmetric about the axis along a longitudinal direction.

As the tip of the tool for wedge bonding is not rotationally symmetric, there is a case in which a direction of the wire feed guide may not be aligned with a direction of connection of the wire as it is depending on the arrangement of the pads and the leads. Accordingly, a bonding head that holds the tool is configured as a rotary type, or a bonding stage that holds the bonding target is rotated. Thus, there is proposed a method of using a capillary having a rotationally symmetric tip, and of pressing the side of the wire with the tip of the capillary to perform bonding.

SUMMARY OF INVENTION

Technical Problems

In the wedge bonding method, an aluminum wire whose stretching property is smaller than that of a gold wire. Therefore, there is a case in which a wire is disconnected while the wire is fed toward a second bonding point after wire bonding at a first bonding point is normally performed. It is possible to determine whether or not a wire is nonsticking or disconnected based on a response of an application of an electrical signal applied between a bonding target and the wire.

The determination on nonsticking and disconnection is usually performed at the first bonding point or at the second bonding point, as this determination is used for determining whether or not bonding is normally made after ultrasonic energy is applied to bond. As described above, disconnection of the wire between the first bonding point and the second bonding point can be detected by performing the determination on nonsticking before bonding at the second bonding point. Unfortunately, when a capillary is moved down in order to perform bonding at the second bonding point, the wire that is prematurely disconnected and projecting from the capillary is also moved down. If the wire is brought into contact with a bonding target, the wire can be erroneously determined to be bonded to the bonding target.

Thus, performing wire bonding at the second bonding point without detecting that the wire has been prematurely disconnected due to the erroneous determination contributes to defective products.

An object of the present invention is to provide a wire-bonding apparatus and a wire bonding method capable of correctly determining whether or not a wire is disconnected between a first bonding point and a second bonding point.

Solution to Problems

A wire-bonding apparatus according to the present invention includes: a first bonding unit configured to bond a wire to a bonding target at a first bonding point of wire bonding; and a nonsticking monitoring unit configured to monitor connection between the wire and the bonding target and determine whether or not the connection changes, the monitoring and the determination being made based on a continuous response to a continuous application of a predetermined electrical signal between the wire held by a capillary and the bonding target during a predetermined continuous monitoring period after the first bonding operation.

Further, it is preferable that the wire-bonding apparatus according to the present invention be configured such that the predetermined continuous monitoring period is a period during which the wire is fed from the first bonding point to a second bonding point for the wire bonding after the first bonding operation.

Further, it is preferable that the wire-bonding apparatus according to the present invention be configured such that the nonsticking monitoring unit applies a predetermined electrical signal between the wire held by the capillary and the bonding target, obtains a capacitance value between the wire held by the capillary and the bonding target, determines that the wire is disconnected from the bonding target when the capacitance value decreases after the first bonding operation, and determines that the disconnected wire drops down and is brought into contact with the bonding target when the capacitance value returns to an original value before reaching the second bonding point.

Further, it is preferable that the wire-bonding apparatus according to the present invention be configured such that the predetermined electrical signal is one of an alternating-current electrical signal and a direct-current pulsed signal.

Further, it is preferable that the wire-bonding apparatus according to the present invention be configured such that the nonsticking monitoring unit determines whether the capacitance value has decreased or returned based on a differential value obtained by differentiating the obtained capacitance value with respect to time.

Further, it is preferable that the wire-bonding apparatus according to the present invention be configured such that the wire bonding at the first bonding point and the second bonding point is performed according to a wedge bonding method.

Further, a wire bonding method according to the present invention includes: a first bonding step of bonding a wire to a bonding target at a first bonding point of wire bonding; a continuous monitoring step of continuously applying a predetermined electrical signal between the wire held by a capillary and the bonding target to obtain a change in a capacitance value between the wire held by the capillary and the bonding target, the continuous monitoring step being performed after the first bonding operation and during a period in which the wire is fed from the first bonding point to a second bonding point of the wire bonding; and a premature disconnection determination step of determining that the wire is prematurely disconnected when the capacitance value decreases after the first bonding operation, and of determining that the wire that has been prematurely disconnected drops down and is brought into contact with the bonding target when the capacitance value returns before the second bonding point.

Further, it is preferable that the wire bonding method according to the present invention be configured such that the predetermined electrical signal is one of an alternating-current electrical signal and a direct-current pulsed signal.

A wire-bonding apparatus according to the present invention includes: a first bonding unit configured to bond a wire to a first bonding target at a first bonding point of wire bonding; a loop forming unit configured to move the wire from the first bonding point to a second bonding point while the wire is fed to form a predetermined loop; a second bonding unit configured to bond the wire to a second bonding target at the second bonding point; and a nonsticking monitoring unit configured to monitor a connecting state of the wire and determine whether or not the connecting state changes, the monitoring and the determination being made based on a continuous response to a continuous application of a predetermined electrical signal between the wire held by a capillary and a bonding stage for supporting the first bonding target and the second bonding target over an entire period from a period before the first bonding operation to a period after the second bonding.

Further, it is preferable that the wire-bonding apparatus according to the present invention be configured such that the nonsticking monitoring unit monitors the connecting state of the wire and determines whether or not the connecting state changes, based on one of a change in a capacitance value and a presence of an electrically short circuit between the wire and the bonding stage.

Further, it is preferable that the wire-bonding apparatus according to the present invention be configured such that the nonsticking monitoring unit determines, based on a first reference value, whether or not the connecting state between the wire and the first bonding target at the first bonding point changes, taking a stable value of the continuous response during a period before the first bonding operation as the first reference value, determines, based on a second reference value, whether or not the connecting state of the wire during the loop forming operation changes, taking a stable value of the continuous response when the first bonding operation is completed as the second reference value, determines, based on a third reference value, whether or not the connecting state between the wire and the second bonding target at the second bonding point changes, taking a stable value of the continuous response during the loop forming operation as the third reference value, and determines, based on a fourth reference value, whether or not the connecting state of the wire during a period from the second bonding point to a point disconnection of the wire is completed changes, taking a stable value of the continuous response when the second bonding operation is completed as the fourth reference value.

Further, it is preferable that the wire-bonding apparatus according to the present invention be configured such that the nonsticking monitoring unit determines whether or not the connecting state of the wire changes, by applying a direct voltage signal to the wire as the predetermined electrical signal, the direct voltage signal having a voltage different from a ground voltage value by a predetermined voltage value, the ground voltage value being a potential of the bonding stage, the predetermined voltage value being taken as the first reference value, the ground voltage value being taken as each of the second to the fourth reference value.

Further, it is preferable that the wire-bonding apparatus according to the present invention be configured such that the wire bonding at the first bonding point and the second bonding point is performed according to one of a wedge bonding method and a ball bonding method.

A wire-bonding apparatus according to the present invention includes: a first bonding step of bonding a wire to a first bonding target at a first bonding point of wire bonding; a loop formation step of moving the wire from the first bonding point to a second bonding point while the wire is fed to form a predetermined loop; a second bonding step of bonding the wire to a second bonding target at the second bonding point; and a nonsticking monitoring step of monitoring a connecting state of the wire and determining whether or not the connecting state changes, the monitoring and the determination being made based on a continuous response to a continuous application of a predetermined electrical signal between the wire held by a capillary and a bonding stage for supporting the first bonding target and the second bonding target over an entire period from a period before the first bonding operation to a period after the second bonding.

Advantageous Effects of Invention

According to at least one of the aspects listed above, it is possible to correctly determine whether or not a wire is disconnected between a first bonding point and a second bonding point.

According to at least one of the aspects listed above, it is possible to correctly determine a change in a connecting state of the wire over an entire period form first bonding operation to second bonding.

DESCRIPTION OF EMBODIMENT

Figure 1:
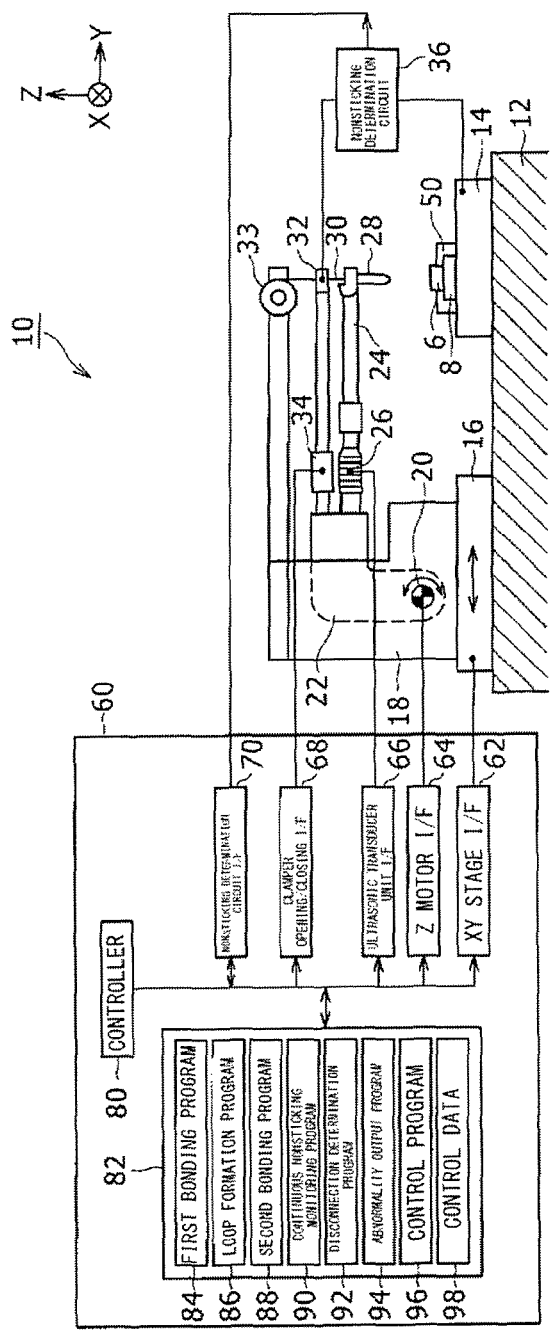
FIG. 1 is a configuration diagram of a wire-bonding apparatus according to an embodiment of the present invention.

Hereinafter, an embodiment according to the present invention will be described with reference to the drawings. In the following description, as target objects of wire bonding, a lead of a circuit board is taken as a first bonding point, and a pad of a chip is taken as a second bonding point. However, this is exemplification for explanation, and the first bonding point can be a pad of the chip, and the second bonding point can be a lead of the circuit board. Both of the first bonding point and the second bonding point can be pads of the chip, or both of the first bonding point and the second bonding point can be leads of the circuit board. The pads and the leads are examples of a target object to which the wire is bonded, and the target object can take a different form. Further, examples of the target object of bonding include, in addition to the chip, a general electronic component such as a resistor chip or a capacitor chip, and the circuit board can be an epoxy resin substrate or the like, or a lead frame or the like.

Dimensions and materials described below are exemplification for explanation, and can be altered appropriately according to specification of a wire-bonding apparatus.

In the following description, a same component and its corresponding components are denoted by the same reference numeral throughout the drawings, and repetitive descriptions shall be omitted.

FIG. 1 is a configuration diagram of a wire-bonding apparatus 10. The wire-bonding apparatus 10 employs a capillary 28 as a tool for wire bonding and an aluminum wire as a wire 30, and connects two bonding targets with the wire 30 according to a wedge bonding method. In FIG. 1, a chip 6 and a circuit board 8 as the bonding targets are illustrated, although these are not included in the components of the wire-bonding apparatus 10. As used herein according to the embodiment of the present invention, the wedge bonding method refers to a bonding method that performs bonding using ultrasonic waves or a pressure without forming an FAB at a tip of the wire.

The wire-bonding apparatus 10 is configured including a bonding stage 14 held on a mount 12, an XY stage 16, and a computer 60.

The bonding stage 14 is a bonding target supporting stage on which the chip 6 and the circuit board 8 as the two bonding targets are placed. The bonding stage 14 is movable with respect to the mount 12 when the circuit board 8 or the like are placed or discharged, but not movable with respect to the mount 12 during a bonding operation. As the bonding stage 14, a metallic moving table can be used. The bonding stage 14 is connected to a reference potential, such as a ground potential of the wire-bonding apparatus 10. The bonding stage 14 is connected to a grounding terminal of a nonsticking determination circuit 36 that will be later described. If the bonding stage 14 is required to be insulated from the chip 6 or the circuit board 8, an insulation treatment is applied to a portion of the bonding stage 14 that is required to be insulated.

The chip 6 is an electronic circuit in which a silicon substrate and a transistor and the like are integrated. As an electronic circuit, input terminals, output terminals, and the like are pulled out as a plurality of pads (not depicted) on an upper surface of the chip 6. A lower surface of the chip 6 is a back surface of the silicon substrate, and constituted as a grounding electrode of the electronic circuit.

The circuit board 8 is configured such that a desired wiring is patterned on an epoxy resin substrate, and includes a chip pad (not depicted) that electrically and mechanically connects and fixes the lower surface of the chip 6, a plurality of leads (not depicted) disposed around the chip pad, and the input terminals and the output terminals of the circuit board pulled out from the chip pad and the plurality of leads. Wire bonding is performed by connecting the pads of the chip 6 and the leads of the circuit board 8 with the wire 30.

A lead clamper 50 provided for the bonding stage 14 is a flat-plate member having an opening in its center and supports the circuit board 8. The lead clamper 50 fixes the circuit board 8 to the bonding stage 14 by holding the circuit board 8 around a peripheral edge of the opening, while the lead of the circuit board 8 and the chip 6 to be connected by wire bonding are positioned in the opening in the center.

The XY stage 16 is a moving table provided with a bonding head 18, and configured to move the bonding head 18 to a desired position in an XY plane with respect to the mount 12 and the bonding stage 14. The XY plane is a plane parallel to an upper surface of the mount 12. A Y direction is parallel to a longitudinal direction of an ultrasonic transducer 24 attached to a bonding arm (not depicted) that will be later described. FIG. 1 shows an X direction and the Y direction, as well as a Z direction that is perpendicular to the XY plane.

The bonding head 18 is fixed to and provided for the XY stage 16. The bonding head 18 is a moving mechanism including a Z motor 20, and configured to move the capillary 28 in the Z direction, by controlling rotation of this motor, through a Z-drive arm 22 and the ultrasonic transducer 24. As the Z motor 20, a linear motor can be used.

To the Z-drive arm 22, the ultrasonic transducer 24 and a wire clamper 32 are attached. The Z-drive arm 22 is a member that is rotatable about a rotation center provided for the bonding head 18 by controlling rotation of the Z motor 20. The rotation center provided for the bonding head 18 is not necessarily an output axis of the Z motor 20, and is set at a position where a rotational load is reduced considering a position of a gravity center as a whole including the Z-drive 22, the ultrasonic transducer 24, and the wire clamper 32.

The ultrasonic transducer 24 is an elongated stick-like member configured such that a base portion of the ultrasonic transducer 24 is attached to the Z-drive arm 22, and the capillary 28 through which the wire 30 is inserted is attached to a tip portion of the ultrasonic transducer 24. To the ultrasonic transducer 24, the ultrasonic vibrator 26 is attached, and the ultrasonic transducer 24 transmits ultrasonic energy produced by driving an ultrasonic vibrator 26 to the capillary 28. Therefore, the ultrasonic transducer 24 is configured in a horned shape that is tapered to the tip so that ultrasonic energy from the ultrasonic vibrator 26 can be efficiently transmitted to the capillary 28. As the ultrasonic vibrator 26, a piezoelectric device can be used.

The capillary 28 is a bonding tool in a conical body with a flat tip surface and having a through hole in its center through which the wire 30 can be inserted along its longitudinal direction. As the capillary 28, a ceramic capillary used in ball bonding can be used as it is. The capillary used in ball bonding has a corner portion in an appropriate shape called chamfer on a side of the tip surface in the through hole so as to be able to easily hold an FAB. In the wedge bonding method according to this embodiment, the capillary for ball bonding is used. The capillary has a flat surface called a face at a lower surface on the side of the tip surface in the through hole of this capillary. The face constitutes a pressing surface when wedge bonding is performed by the wire-bonding apparatus 10.

At a tip portion of a tool for wedge bonding, a wire feed guide inclined with respect to its longitudinal direction and a pressing surface for pressing a side surface of the wire are provided. Therefore, the wire projects laterally in a direction along the direction of the wire feed guide, instead of in a manner rotationally symmetric about an axis along the longitudinal direction of the tool. If such a tool for wedge bonding is used, there is a case in which the direction of the wire feed guide does not match the direction in which the wire is to be bonded depending on positions of the leads and the pads.

For example, if the chip 6 is mounted at a central portion of the circuit board 8, the plurality of pads are arranged along a peripheral end of the chip 6, and the plurality of leads are provided for the circuit board 8 so as to encircle around the chip 6, the connecting direction of the wire between a lead and a pad varies each time when wire bonding is performed a plurality of times. In order to align the direction of the wire feed guide with the connecting direction of the wire, it is necessary either to cause the tool for wedge bonding to be rotate around the axis along the longitudinal direction, or to rotate the circuit board 8.

By contrast, as the face of the capillary 28 on the side of the tip surface is rotationally symmetrical about the axis of the capillary 28 along the longitudinal direction, even if the connecting direction of the wire between a lead and a pad varies each time of wire bonding, it is sufficient to perform a shaping operation for slightly changing the direction of the wire 30 projecting from the tip of the capillary 28. Accordingly, the capillary 28 is used in wedge bonding.

The wire 30 inserted through the capillary 28 is an aluminum fine wire. The wire 30 is wound around a wire spool 33 provided at a tip of a wire holder extending from the bonding head 18, and inserted into the through hole in the center of the capillary 28 from the wire spool 33 via the wire clamper 32. The wire 30 then projects from the tip of the capillary 28. Examples of a material of the wire 30 include a fine wire in which silicon, magnesium, and such are appropriately mixed, in addition to a pure aluminum fine wire. A diameter of the wire 30 can be selected depending on the bonding target. One example of the diameter of the wire 30 is 30 μm.

The wire clamper 32 is a wire clamping device attached to the Z-drive arm 22, and having a pair of clamping plates respectively disposed on the both sides of the wire 30. The wire clamper 32 is configured to cause the wire 30 to be in a freely movable state by opening the facing clamping plates, and cause the wire 30 to be not movable by closing the facing clamping plates. As being attached to the Z-drive arm 22, the wire clamper 32 is able to appropriately clamp the wire 30 even when the capillary 28 moves in any direction in X, Y, or Z. Opening/closing of the wire clamper 32 is performed by activating a clamper opening/closing unit 34 employing a piezoelectric device.

The nonsticking determination circuit 36 is a circuit that determines whether or not connection between the bonding target and the wire 30 is appropriate at every step of wire bonding. The nonsticking determination circuit 36 applies a predetermined electrical signal between the bonding target and the wire 30, and determines whether or not the connection between the bonding target and the wire 30 is appropriate based on a response of the application.

Figure 2:
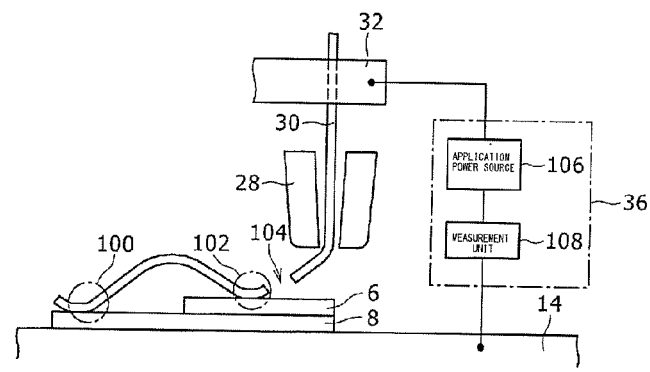
FIG. 2 is a diagram illustrating a nonsticking determination circuit of the wire-bonding apparatus according to the embodiment of the present invention.

FIG. 2 is a configuration diagram illustrating the nonsticking determination circuit 36. The figure shows that the wire 30 is in a disconnected state 104 at a second bonding point 102 after determining that wire bonding is appropriately performed at a first bonding point 100, going through the loop formation step, moving to the second wire bonding step to determine that wire bonding is appropriately performed at the second bonding point 102 in the second wire bonding step, and then appropriately disconnecting the wire. In this manner, a case in which the steps of wire bonding are normally performed is illustrated.

The nonsticking determination circuit 36 is configured by an application power source 106 and a measurement unit 108, and having one terminal connected to the bonding stage 14 and the other terminal connected to either the wire clamper 32 or the wire spool 33. Taking the application power source 106 as an alternate voltage power supply, it is possible to learn a capacitance component between the wire 30 and the bonding stage 14 by measuring an impedance value using the impedance measuring circuit within the measurement unit 108.

It should be noted that, as the application power source 106, a direct-current pulsed power supply can be used in place of an alternate voltage power supply. In the following description, it is assumed that the application power source 106 is an alternate voltage power supply.

When the wire 30 is connected to a lead of the circuit board 8 or a pad of the chip 6, a value of a capacitance component between the wire clamper 32 and the bonding stage 14 is equal to a total value of an apparatus capacitance value as capacitance values of the components of the wire-bonding apparatus 10 and a device capacitance value as a capacitance value of the circuit board 8 or the chip 6. By contrast, when the wire 30 is in the disconnected state 104, a state between the wire 30 and the circuit board 8 or the chip 6 is in an electrically open state, and the value of the capacitance component between the wire clamper 32 and the bonding stage 14 is equal to the apparatus capacitance value alone. The nonsticking determination circuit 36 is able to determine whether the state between the wire 30 and one of the circuit board 8 and the chip 6 as a bonding target is the connected state or the open state based on a change in the capacitance component by the measurement unit 108.

When the steps of wire bonding are normally performed as illustrated in FIG. 2, the nonsticking determination circuit 36 makes determination in each step in the following manner. After the first wire bonding operation at the first bonding point 100, it is determined that the wire 30 and the circuit board 8 are in the connected state if the capacitance value between the bonding stage 14 and either the wire clamper 32 or a wire spool 33 is equal to the total value of the apparatus capacitance value and the device capacitance value. Similarly, when the capillary 28 is moved down toward the second bonding point 102 and brought into contact with the second bonding point 102, it is determined that the wire 30 and the circuit board 8 are in the connected state if the capacitance value between the wire clamper 32 and the bonding stage 14 is equal to the total value of the apparatus capacitance value and the device capacitance value.

After the second wire bonding operation at the second bonding point 102, it is determined that the wire 30 and the chip 6 are in the connected state if the capacitance value between the wire clamper 32 and the bonding stage 14 is equal to the total value of the apparatus capacitance value and the device capacitance value. After the operation of disconnecting the wire, it is determined that the wire 30 and the chip 6 are in the disconnected state if the capacitance value between the wire clamper 32 and the bonding stage 14 is equal to the value of the apparatus capacitance value.

Referring back to FIG. 1, the computer 60 controls operations of the components of the wire-bonding apparatus 10 as a whole. The computer 60 includes a controller 80 as a CPU, various interface circuits, and a memory 82. These components are connected with each other via an internal bus.

The various interface circuits are drive circuits or buffer circuits provided between the controller 80 as a CPU and the respective components of the wire-bonding apparatus 10. In FIG. 1, the interface circuits are simply referred to as I/Fs. The various interface circuits include an XY stage I/F 62 connected to the XY stage 16, a Z motor I/F 64 connected to the Z motor 20, an ultrasonic vibrator I/F 66 connected to the ultrasonic vibrator 26, a clamper opening/closing I/F 68 connected to the clamper opening/closing unit 34, and a nonsticking determination circuit I/F 70 connected to the nonsticking determination circuit 36.

The memory 82 is a storage device that stores various programs and various control data. The various programs include a first bonding program 84 relating to the first wire bonding operation, a loop formation program 86 relating to a loop forming operation, a second bonding program 88 relating to the second wire bonding operation, a continuous nonsticking monitoring program 90 relating to a continuous monitoring operation by the nonsticking determination circuit 36, a disconnection determination program 92 relating to determination of premature disconnection of the wire 30, an abnormality output program 94 relating to an operation of outputting abnormal signal indicating that the wire 30 is prematurely disconnected, and a control program 96 relating to other control operations. Examples of control data 98 include data required when executing the various programs and the control program.

Figure 3:
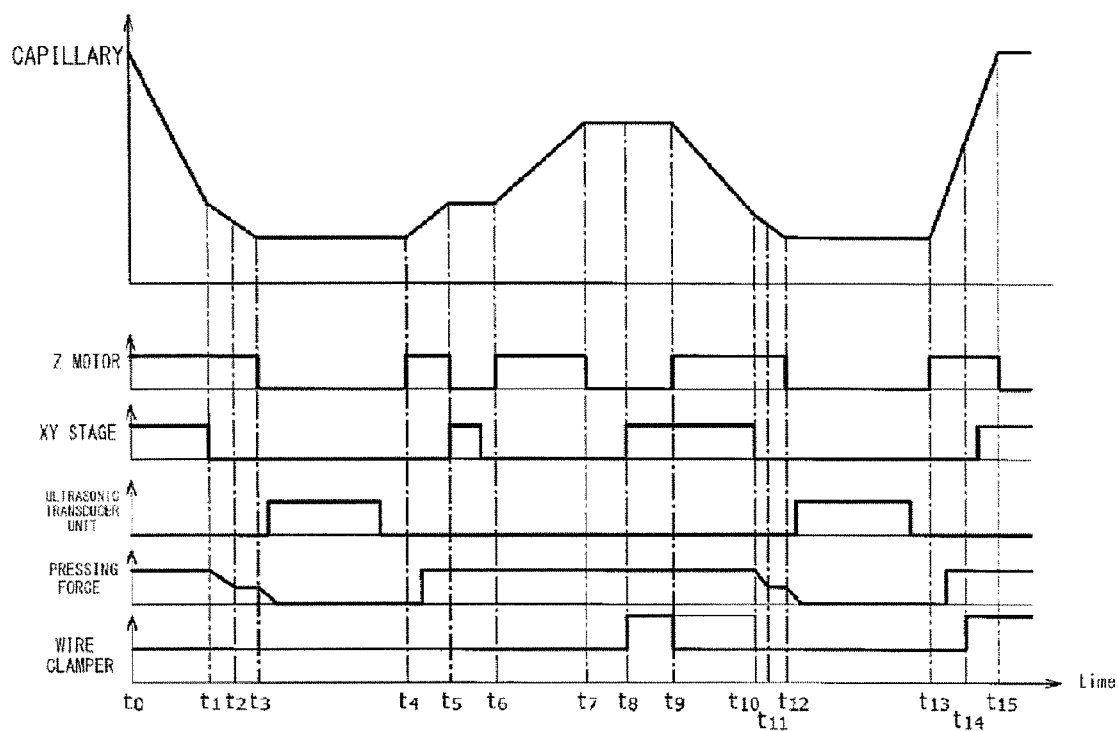
FIG. 3 is a time chart showing operations of components of the wire-bonding apparatus according to the embodiment of the present invention.
Figure 4:
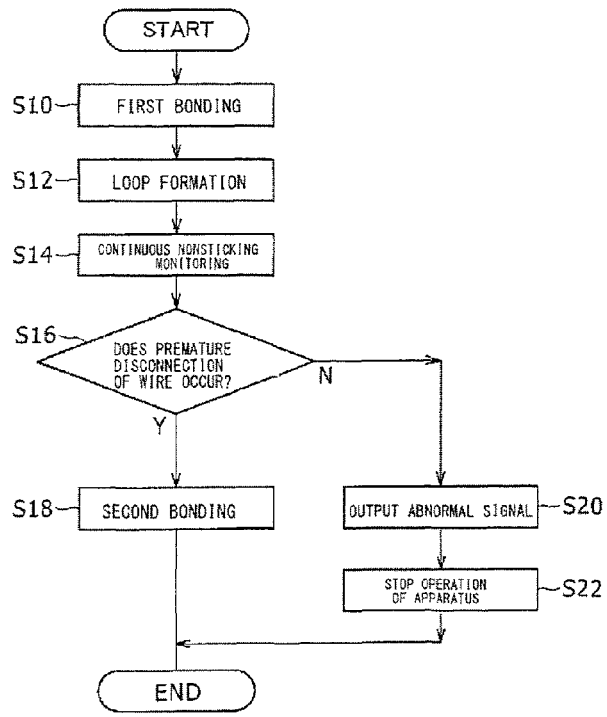
FIG. 4 is a flowchart showing steps of a wire bonding method according to the embodiment the present invention.
Figure 5:
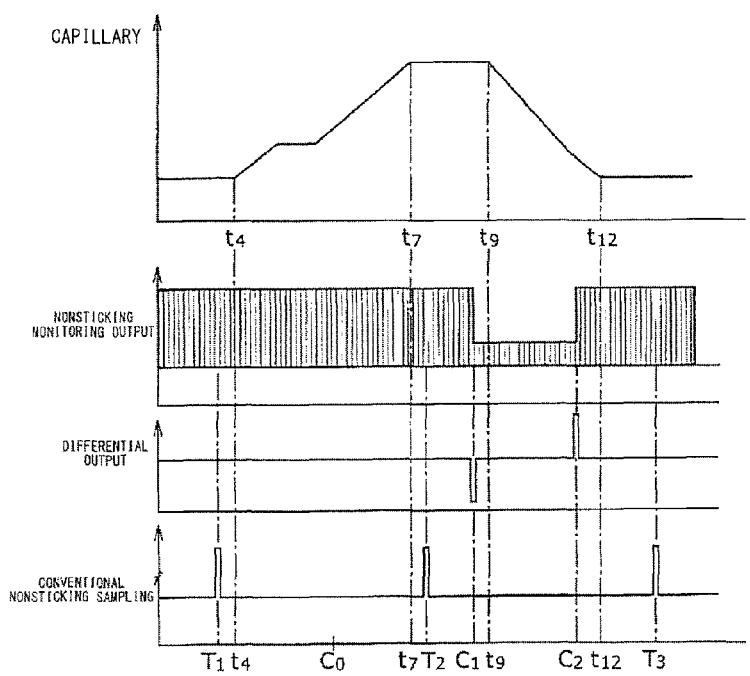
FIG. 5 is a chart showing continuous monitoring of wire disconnection between a first bonding point and a second bonding point in the wire-bonding apparatus according to the embodiment of the present invention.

Effects of the above configuration, in particular, functions of the computer 60 will be described in further detail with reference to FIG. 3 and the following figures. FIG. 3 is a time chart showing operations of components in the wire bonding operation. FIG. 4 is a flowchart showing steps of a wire bonding method. FIG. 5 is a time chart showing signals relating to nonsticking monitoring between the first bonding point and the second bonding point in association with movement of the capillary 28. FIG. 6 to FIG. 9 respectively show the state of the wire between the first bonding point and the second bonding point.

FIG. 3 is the time chart showing movement of the components from the first wire bonding operation at the first bonding point 100 until the second wire bonding operation and the wire disconnection at the second bonding point 102 via the loop forming operation. A horizontal axis in FIG. 3 represents time. A vertical axis in FIG. 3 represents, from top to bottom, height of the capillary 28, whether the Z motor 20 is operating or stopped, whether the XY stage 16 is operating or stopped, whether the ultrasonic vibrator 26 is operating or stopped, a magnitude of a pressing force for pressing the capillary 28 downward, and whether the wire clamper 32 is in a closed state or an open state.

The height of the capillary 28 changes when the Z motor 20 is operating, and does not change when the Z motor 20 is stopped. The Z motor 20 is controlled to operate and stop such that when the controller 80 executes the various programs, the Z motor 20 is driven via the Z motor I/F 64 if there is a command for operating the Z motor 20 and stopped if there is a stopping command. The capillary 28 changes its position within the XY plane other than the height based on its movement within the XY plane. The movement of the capillary 28 within the XY plane is controlled such that when the controller 80 executes the various programs, the XY stage 16 is driven to move via the XY stage I/F 62 if there is a command for moving the XY stage 16 and stopped if there is a stopping command.

When the capillary 28 is at the first bonding point 100 or at the second bonding point 102, ultrasonic energy is supplied to the capillary 28 from the ultrasonic vibrator 26. Supply of ultrasonic energy from the ultrasonic vibrator 26 is controlled such that when the controller 80 executes the various programs, the ultrasonic vibrator 26 is actuated via the ultrasonic vibrator I/F 66 if there is a command for actuating the ultrasonic vibrator 26 and stopped if there is a stopping command.

When the capillary 28 is at the first bonding point 100 or at the second bonding point 102, a predetermined pressing force is supplied to the capillary 28 via the ultrasonic transducer 24. A magnitude of the pressing force can be controlled as a part of the controlling of the Z motor 20 to drive. Specifically, when the controller 80 executes the various programs, the pressing force is changed, if there is a command for changing the pressing force, by the Z motor 20 being controlled to drive via the Z motor I/F 64.

In the loop forming operation and the operation of disconnecting the wire, the wire clamper 32 is opened when the wire 30 is fed from the capillary 28, and the wire clamper 32 is closed when feeding of the wire 30 is stopped and the wire 30 is clamped. Opening/closing of the wire clamper 32 is controlled such that when the controller 80 executes the various programs, the clamper opening/closing unit 34 is caused to open the wire clamper 32 via the clamper opening/closing I/F 68 if there is a command for opening the wire clamper 32, and the clamper opening/closing unit 34 is caused to close the wire clamper 32 if there is a closing command.

In FIG. 3, a period from time $t_0$ to time $t_4$ corresponds to a period for the first wire bonding step, during which period the controller 80 executes the first bonding program 84. As shown in FIG. 3, the XY stage 16 is driven to move during a period from time $t_0$ to time $t_1$ to move the capillary 28 immediately above the first bonding point. The Z motor 20 is driven from time $t_0$ to time $t_3$, and whereby the capillary 28 continues to move downward. The downward movement is made at high speed from time $t_0$ to time $t_1$ at which the capillary 28 is moved immediately above the first bonding point 100, and at low speed from time $t_1$ to time $t_3$ at which the capillary 28 is brought into contact with the lead of the circuit board 8. The low-speed lowering is referred to as first searching (1'st searching).

During a period from time $t_3$ to time $t_4$, both the XY stage 16 and the Z motor 20 are stopped, and the ultrasonic vibrator 26 is actuated to supply ultrasonic energy to the capillary 28. The pressing force changes in stages from time $t_1$ to time approximately when the ultrasonic vibrator 26 starts to be actuated. In this manner, during the period from time $t_3$ to time $t_4$, the wire 30 projecting from the tip of the capillary 28 is clamped between the tip of the capillary 28 and the lead of the circuit board 8 at the first bonding point 100, and bonding between the wire 30 and the lead is performed by ultrasonic energy and a pressing force. During the bonding operation, it is preferable that the bonding stage 14 is heated and maintained at an appropriate treating temperature.

In FIG. 3, a period from time $t_4$ to time $t_{10}$ corresponds to a period for the loop formation step. The pressing force returns to an initial state at this time. During this period, the controller 80 executes the loop formation program 86. As shown in FIG. 3, only the Z motor 20 is driven during a period from time $t_4$ to time $t_5$, and whereby the capillary 28 is slightly moved upward. During a period from time $t_5$ to time $t_6$, only the XY stage 16 is driven to move. This driving for movement is made as a reverse motion in which the capillary 28 is temporarily moved from the first bonding point 100 to a side opposite of the second bonding point 102 within the XY plane. During a period from time $t_6$ to time $t_7$, only the Z motor 20 is driven, and the capillary 28 is moved upward at a position to which the capillary 28 has been moved in the reverse motion. Then, this state is maintained through a period from time $t_7$ to time $t_8$. This state forms a peak of a loop of the wire 30. During a period from time $t_8$ to time $t_9$, the XY stage 16 is drive to move slightly while the wire clamper 32 is closed. This driving for movement is made so as to move the capillary 28 toward the second bonding point 102 from the position to which the capillary 28 has been moved in the reverse motion within the XY plane. With this, the loop is pulled toward the side of the second bonding point 102, and the peak of the loop is adjusted to be a desired height.

At time $t_9$, the wire clamper 32 is opened to allow the wire 30 to be fed from the tip of the capillary 28. Then, during a period from time $t_9$ to time $t_{10}$, the XY stage 16 is driven to move, and the Z motor 20 is driven. With this, the capillary 28 is moved down toward the second bonding point 102 while the wire 30 is fed and the loop is directed downward.

At time $t_{10}$, the capillary 28 comes immediately above the second bonding point 102. A period from time $t_{10}$ to time $t_{13}$ corresponds to a period for the second wire bonding step at the second bonding point 102. During this period, the controller 80 executes the second bonding program 88. The downward movement of the capillary 28 is made at high speed from time $t_9$ to time $t_{10}$ at which the capillary 28 is moved immediately above the second bonding point 102, and at low speed from time $t_{10}$ to time $t_{12}$ at which the capillary 28 is brought into contact with the pad of the chip 6. The low-speed lowering is referred to as second searching (2'nd searching).

During a period from time $t_{12}$ to time $t_{13}$, both the XY stage 16 and the Z motor 20 are stopped, and the ultrasonic vibrator 26 is actuated to supply ultrasonic energy to the capillary 28. The pressing force changes in stages from time $t_{10}$ to time approximately when the ultrasonic vibrator 26 starts to be actuated. In this manner, during the period from time $t_{12}$ to time $t_{13}$, the wire 30 projecting from the tip of the capillary 28 is clamped between the tip of the capillary 28 and the pad of the chip 6 at the second bonding point 102, and bonding between the wire 30 and the lead is performed by ultrasonic energy and a pressing force. During the bonding operation, it is preferable that the bonding stage 14 is heated and maintained at an appropriate treating temperature.

In FIG. 3, a period from time $t_{13}$ to time $t_{15}$ corresponds to a period for a wire disconnecting step. The wire disconnecting step can be provided separately from the second wire bonding operation performed by the controller 80 executing a wire disconnecting program intended for an exclusive use. Alternatively, this period can be included in the second wire bonding step, and the wire disconnecting program can be included in the second bonding program 88.

In the wire disconnecting step, the pressing force returns to an initial state. As shown in FIG. 3, only the Z motor 20 is driven during a period from time $t_{13}$ to time $t_{14}$, and whereby the capillary 28 is slightly moved upward. During a period from time $t_{14}$ to time $t_{15}$, the wire clamper 32 is closed, the XY stage 16 is driven to move, and the Z motor 20 is driven. This driving for movement is made such that the capillary 28 moves within the XY plane while moving upward. With this, the wire 30 is disconnected at the second bonding point 102.

In this manner, the second wire bonding operation at the second bonding point 102 and the wire disconnection is performed after the first wire bonding operation at the first bonding point 100 and the loop forming operation.

Effects of the above configuration, in particular, functions of the continuous nonsticking monitoring by the controller 80, the determination on the premature disconnection of the wire 30, and the like will be described in further detail with reference to FIG. 4 through FIG. 9. FIG. 4 is a flowchart showing the steps from the first wire bonding operation to the second wire bonding operation out of the steps of the wire bonding method, and the steps correspond respectively to processing steps of the programs stored in the memory 82 of the computer 60. When the wire-bonding apparatus 10 is turned on, the components of the wire-bonding apparatus 10 including the computer 60 are initialized.

Next, the bonding stage 14 is pulled out once, and the circuit board 8 having the chip 6 mounted thereon as a bonding target positioned and placed on the bonding stage 14 and then pressed and fixed by the lead clamper 50. Then, the bonding stage 14 is moved back to an initial position. It should be noted that the bonding stage 14 is heated up to a predetermined temperature determined based on the bonding conditions. The bonding target setting step is automatically performed using of an automated carrier device of the circuit board 8.

Thereafter, the first bonding program 84 is executed by the controller 80, and the first wire bonding is performed at the first bonding point 100 (S10). The first bonding point 100 is set on one of the leads of the circuit board 8. The first bonding point 100 is set using a positioning camera or the like that is not illustrated in FIG. 1. The operations of the components in the first wire bonding operation are not described in further detail, as having been described with reference to FIG. 3.

At the first bonding point 100, the wire 30 is sandwiched and pressed between a portion of the tip of the capillary 28 and the lead of the circuit board 8 to bond the wire 30 to the lead by the ultrasonic vibration energy by the ultrasonic vibrator 26 and a pressing force of the capillary 28 by the Z motor 20 being controlled to drive, as well as a heating temperature from the bonding stage 14 if necessary. In this manner, the first wire bonding at the first bonding point 100 is performed.

After the first wire bonding is completed, the loop forming operation is performed (S12). This step is performed by the controller 80 executing the loop formation program 86. Specifically, after the first wire bonding is completed, the capillary 28 is moved upward while the wire clamper 32 is open, and then moved immediately above the second bonding point 102. The second bonding point 102 is set on one of the pads of the chip 6. During the movement of the capillary 28, the wire 30 is fed from the wire spool 33 and extends from the tip of the capillary 28 by a required length. The operations of the components in the loop forming operation are not described in further detail, as having been described with reference to FIG. 3.

During the loop forming operation, the continuous nonsticking monitoring is performed (S14). This step is performed by the controller 80 executing the continuous nonsticking monitoring program 90. The continuous nonsticking monitoring is performed by actuating the nonsticking determination circuit 36 continuously in response to a command from the controller 80 via the nonsticking determination circuit I/F 70, and by the controller 80 continuously receiving a result of the determination.

The continuously actuation of the nonsticking determination circuit 36 is made such that an alternate voltage power supply which is the application power source 106 described with reference to FIG. 2 is continuously actuated during a previously determined continuous monitoring period. With this, an alternate voltage signal is continuously applied between the wire 30 held by the capillary 28 and the bonding stage 14. The measurement unit 108 described with reference to FIG. 2 obtains a capacitance value between the wire 30 held by the capillary 28 and the bonding stage 14, and sequentially transmits the value to the controller 80 via the nonsticking determination circuit I/F 70.

Based on the continuous nonsticking monitoring, it is determined whether or not the wire is prematurely disconnected (S16). This step is performed by the controller 80 executing the disconnection determination program 92.

FIG. 5 shows a temporal change in each signal in the continuous nonsticking monitoring in association with a movement state of the capillary 28. A horizontal axis in FIG. 5 represents time. A vertical axis represents, from top to bottom in the chart, the movement state of the capillary 28, a nonsticking monitoring output that is output from the measurement unit 108 of the nonsticking determination circuit 36, a differential output obtained by differentiating the nonsticking monitoring output, and nonsticking monitoring timing in the conventional technique.

Time $t_4$, $t_7$, $t_9$, and $t_{12}$ in the horizontal axis are the same as those described with reference to FIG. 3. Specifically, time $t_4$ is a timing at which the loop forming operation is started after the bonding operation at the first bonding point 100 is finished, a period from time $t_7$ to time $t_9$ is the peak of the loop is formed in the loop formation, and $t_{12}$ is a timing at which the capillary 28 is moved down to be brought into contact with the second bonding point 102. Time $t_1$, $T_2$, $T_3$ are timing for the nonsticking monitoring in the conventional technique as shown in the bottom of FIG. 5. Here, time $t_1$, $T_2$, $T_3$ are respectively set to be timing immediately before time $t_4$, immediately after time $t_7$, and after $t_{12}$. The above timing is a mere example, and the nonsticking monitoring is often performed at appropriate sampling timing other than the above example.

As shown by the nonsticking monitoring output that is shown the second from the top in FIG. 5, the nonsticking determination circuit 36 continues to be actuated, not at sampling timing in the conventional technique, but during the previously set continuous monitoring period. The continuous monitoring period is set to be a period suitable for monitoring whether or not the wire 30 is disconnected between the first bonding point and the second bonding point after the first bonding operation. Here, an entire period from the first bonding point to the second bonding point is set as the continuous monitoring period. Alternatively, a period from $T_1$ to $T_3$ used in the conventional technique, for example, can be set as the continuous monitoring period. Alternatively, leaving $T_1$ and $T_3$ in the sampling timing for the nonsticking monitoring in the conventional technique as they are, a period from time $t_7$ at which the capillary 28 comes to a highest position to time $t_{12}$ at which the capillary 28 comes to a lowest position can be set as the continuous monitoring period.

The nonsticking monitoring output is an output from the measurement unit 108 of the nonsticking determination circuit 36, and indicates a temporal change in the capacitance value. In FIG. 5, the capacitance value is maintained substantially at a constant value from time $C_0$ to time $C_1$ during which the capillary 28 is moving upward, for example, and quickly decreases at $C_1$. Upon disconnection of the wire 30, the capacitance value detected by the measurement unit 108 changes from "the total value of the apparatus capacitance value and the device capacitance value" to "the apparatus capacitance value", and therefore it is possible to determine that the wire 30 is disconnected at time $C_1$. While the capacitance value is maintained at the decreased value from time $C_1$ to time $C_2$, the capacitance value quickly returns to the original high value at time $C_2$. This is considered because the capacitance value returns from "the apparatus capacitance value" to "the total value of the apparatus capacitance value and the device capacitance value", it is possible to determine that the wire 30 extending from the tip of the capillary 28 is brought into contact with the circuit board 8 or the chip 6 due to the premature disconnection of the wire 30.

In this manner, by obtaining the capacitance value between the wire 30 held by the capillary 28 and the bonding stage 14, it is possible to determine that the wire 30 is disconnected in the middle of the loop when the capacitance value decreases after the first bonding operation. Further, when the capacitance value returns before reaching the second bonding point, it is possible to determine that the wire 30 that has been disconnected is brought into contact with the circuit board 8 or the chip 6 as the bonding target.

According to the sampling timing for the nonsticking monitoring in the conventional technique, the capacitance value does not change remaining at the same value at either of time t1, T2, or T3, and therefore it is not possible to detect the premature disconnection of the wire 30.

In the above description, the determination on whether or not the wire 30 is prematurely disconnected is made based on the change in the capacitance value. The change in the capacitance value can be detected using a threshold capacitance value and by comparison with the threshold capacitance value. Alternatively, it is possible to determine whether or not the wire 30 is prematurely disconnected based on a differential value obtained by differentiating an electrical signal indicating the capacitance value with respect to time. The differential output in FIG. 5 is obtained by differentiating the nonsticking monitoring output with respect to time. When the capacitance value quickly decreases, a negative pulse is output, and when the capacitance value quickly increases, a positive pulse is output. It is possible to determine whether or not the wire 30 is prematurely disconnected based on a presence of the pulsed output.

FIG. 6 to FIG. 9 shows the state of the wire 30 at time $t_4$, time $C_0$, time $C_1$, and time $C_2$, respectively.

Figure 6:
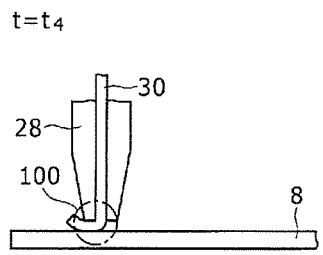
FIG. 6 is a diagram illustrating first bonding operation in FIG. 4.

At time $t_4$ shown in FIG. 6, the wire 30 projecting from the tip of the capillary 28 is sandwiched between the tip of the capillary 28 and the lead of the circuit board 8 at the first bonding point 100. Therefore, the capacitance value detected by the measurement unit 108 is "the total value of the apparatus capacitance value and the device capacitance value".

Figure 7:
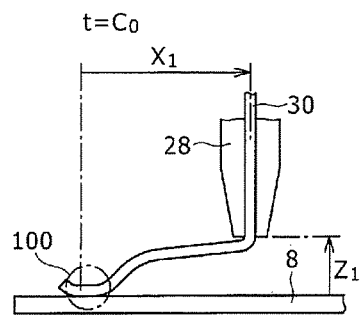
FIG. 7 is a diagram illustrating the wire is fed in a loop forming operation after FIG. 6.

At time $C_0$ shown in FIG. 7, the capillary 28 moves from the first bonding point 100 by X1 within the XY plane, and the height in the Z direction increases up to Z1 from an upper surface of the circuit board 8. The wire 30 is bonded to the circuit board 8 at the first bonding point 100, and the wire 30 is fed from the capillary 28. Also in this case, the capacitance value detected by the measurement unit 108 is "the total value of the apparatus capacitance value and the device capacitance value".

Figure 8:
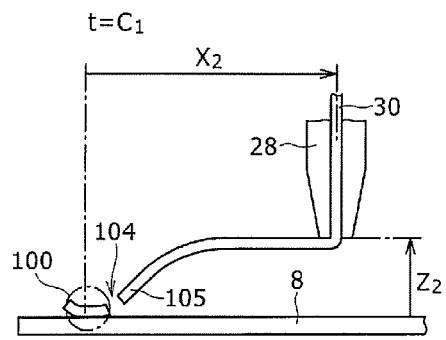
FIG. 8 is a diagram illustrating an occurrence of wire disconnection after FIG. 7.

Time $C_1$ shown in FIG. 8 shows a state in which the height of the capillary 28 in the Z direction is maximized at Z2, and the wire clamper 32 is closed and the XY stage 16 moves from the first bonding point 100 by a distance X2 within the XY plane (see FIG. 3). This shows that the wire 30 is brought into the disconnected state 104 between the first bonding point 100 and the tip of the capillary 28. The wire 30 extends from the capillary 28 toward the first bonding point 100, and a portion that has been disconnected constitutes a tip portion 105. It should be noted that the state at time $C_1$ described above at which the wire is disconnected is one example, and the wire can be disconnected in a different state as long as it is in the middle of the movement from the first bonding point 100 to the second bonding point 102.

At this time, the capacitance value detected by the measurement unit 108 quickly decreases from "the total value of the apparatus capacitance value and the device capacitance value" down to "the apparatus capacitance value". According to the continuous nonsticking monitoring, it is possible to determine that the wire 30 is disconnected in the middle of the loop by detecting that the capacitance value decreases quickly.

Figure 9:
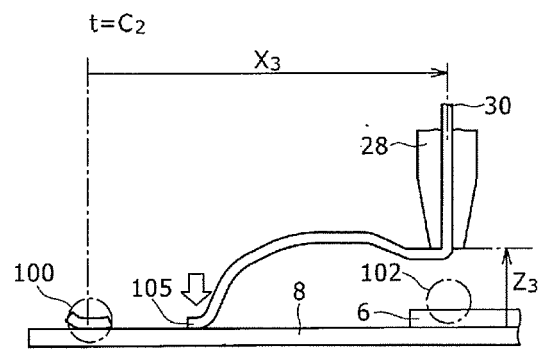
FIG. 9 is a diagram illustrating that a capillary is moved down after FIG. 8 and the disconnected wire is brought into contact with a bonding target.

Time $C_2$ shown in FIG. 9 shows a state in which the capillary 28 moves downward in the Z direction to a height of Z3 while moving from the first bonding point 100 within the XY plane by a distance X3, and the tip of the capillary 28 comes immediately above the second bonding point 102. $Z_3$ is a value smaller $Z_2$ than in FIG. 8, and $X_3$ is a value greater than $X_2$ in FIG. 8. At this time, the tip portion 105 of the wire 30 extending from the capillary 28 is brought into contact with the circuit board 8 due to the downward movement of the capillary 28. At this time, the capacitance value detected by the measurement unit 108 quickly increases and returns to "the total value of the apparatus capacitance value and the device capacitance value". According to the continuous nonsticking monitoring, when a quick increase of the capacitance value is detected, in combination with the detection of the quick decrease of the capacitance value at time $C_1$, it is possible to determine that this does not indicate normal connection between the wire 30 and the first bonding point 100, and that the wire 30 is disconnected in the middle of the loop and the tip portion 105 of the wire drops and is brought into contact with the bonding target.

Referring back to FIG. 4, when it is determined that the wire is not prematurely disconnected as the result of the determination at S14 on whether or not the wire is prematurely disconnected, then, the second wire bonding operation is performed at the second bonding point 102 (S18). This step is performed by the controller 80 executing the second bonding program 88. The second bonding point 102 is set on one of the pads of the chip 6. The second bonding point 102 is set using a positioning camera or the like that is not illustrated in FIG. 1. The operations of the components in the second wire bonding operation are not described in further detail, as having been described with reference to FIG. 3.

When it is determined that the wire is prematurely disconnected as the result of the determination on whether or not the wire is prematurely disconnected in S16, an abnormal signal is output (S20), and the operation of the wire-bonding apparatus 10 is stopped (S22). These steps are performed by the controller 80 executing the abnormality output program 94.

In this manner, by continuously actuating the nonsticking determination circuit 36 to perform the continuous nonsticking monitoring, even when an aluminum wire whose expanding property is smaller than that of a gold wire is used in the wedge bonding by the capillary 28, it is possible to correctly determine whether or not the wire is disconnected between the first bonding point 100 and the second bonding point 102.

In the above description, the predetermined continuous monitoring period is set to be the period during which the wire is fed from the first bonding point to the second bonding point after the first bonding operation. However, the continuous monitoring period can be set to be an entire period from a period before the first bonding operation to a period after the second bonding.

During the continuous monitoring period, the nonsticking monitoring unit continuously applies a predetermined electrical signal between the wire 30 held by the capillary 28 and the bonding stage 14. Then, a change in a connecting state of the wire 30 is monitored and determined using an appropriate threshold for determination to the continuous response.

Taking the nonsticking of the wire at the first bonding point is F1, the premature disconnection of the wire during the loop formation period is F2, the nonsticking of the wire at the second bonding point is F3, and the premature disconnection of the wire after the second bonding operation and before the operation of disconnecting the wire is F4, appropriate thresholds for F1 to F4 respectively are used. In this manner, it is possible to monitor while distinguishing between F1 to F4.

Hereinafter, performing the continuous monitoring over an entire period from the period before the first bonding operation to the period after the second bonding and distinguishing between F1 to F4 will be described in detail with reference to FIG. 10 through FIG. 12.

Figure 10:
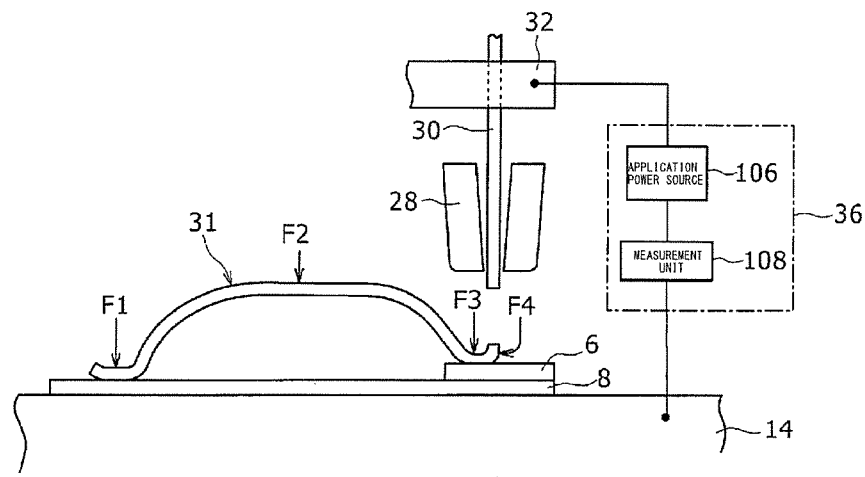
FIG. 10 is a diagram illustrating nonsticking and premature disconnection of the wire that can possibly occur over an entire period from the first bonding point after the second bonding point in the wire-bonding apparatus according to the embodiment of the present invention.

FIG. 10 is a view, corresponding to FIG. 6 through FIG. 9, but further illustrating bonding of the wire 30 over an entire period from the period before the first bonding operation to the period after the second bonding. Here, a wire 31 to which the operations including the first bonding operation performed at the first bonding point on the circuit board 8, the loop forming operation after the first bonding operation, the second bonding operation performed at the second bonding point on the chip 6 after the loop forming operation, and the operation of disconnecting the wire 30 after the second bonding operation are performed without any problem.

FIG. 10 shows F1 at which nonsticking of the wire occurs at the first bonding point, F2 at which premature disconnection of the wire occurs in the loop formation period, F3 at which nonsticking of the wire occurs at the second bonding point, and F4 at which premature disconnection of the wire occurs before the operation of disconnecting the wire after the second bonding operation.

The nonsticking determination circuit 36 illustrated in FIG. 10 is the same as that has been described with reference to FIG. 2, and includes the application power source 106 configured to output a predetermined electrical signal, and the measurement unit 108 configured to measure a response to the predetermined electrical signal. Here, an alternate voltage signal or a direct voltage signal is used as the predetermined electrical signal.

Either of the alternate voltage signal and the direct voltage signal is used depending on whether or not both of the chip 6 and the circuit board 8 are determined to be connected to the bonding stage 14 only by an electrically resistance component. When both of the chip 6 and the circuit board 8 are determined to be connected to the bonding stage 14 only by an electrically resistance component, the direct voltage signal can be used as the predetermined electrical signal. When both of the chip 6 and the circuit board 8 are determined to be connected to the bonding stage 14 not only by an electrically resistance component, but also by a capacitance component, the alternate voltage signal can be used as the predetermined electrical signal.

When using the alternate voltage signal as the predetermined electrical signal, the measurement unit 108 measures a change in the capacitance value between the wire 30 and the bonding stage 14 via the wire clamper 32. The capacitance value can be converted into a voltage value using an appropriate conversion circuit, and it is possible to measure the change in the capacitance value by measuring a change in the voltage value after the conversion. When using the direct voltage signal as the predetermined electrical signal, the measurement unit 108 measures a change in a presence of an electric short circuit between the wire 30 and the bonding stage 14 via the wire clamper 32.

The presence of the electrically short circuit is determined by measuring the voltage value in the following manner. Specifically, taking a potential of the bonding stage as a ground voltage value V=0 (V), a direct voltage signal having a voltage higher than the ground voltage value by a predetermined voltage value $V_0$ is set as the predetermined electrical signal. Then, when the measured voltage value is V=0 (V), it is determined that there is an electrically short circuit between the wire 30 and the bonding stage 14, and when the measured voltage value is the predetermined voltage value $V_0$, it is determined that there is no electrically short circuit.

Figure 11:
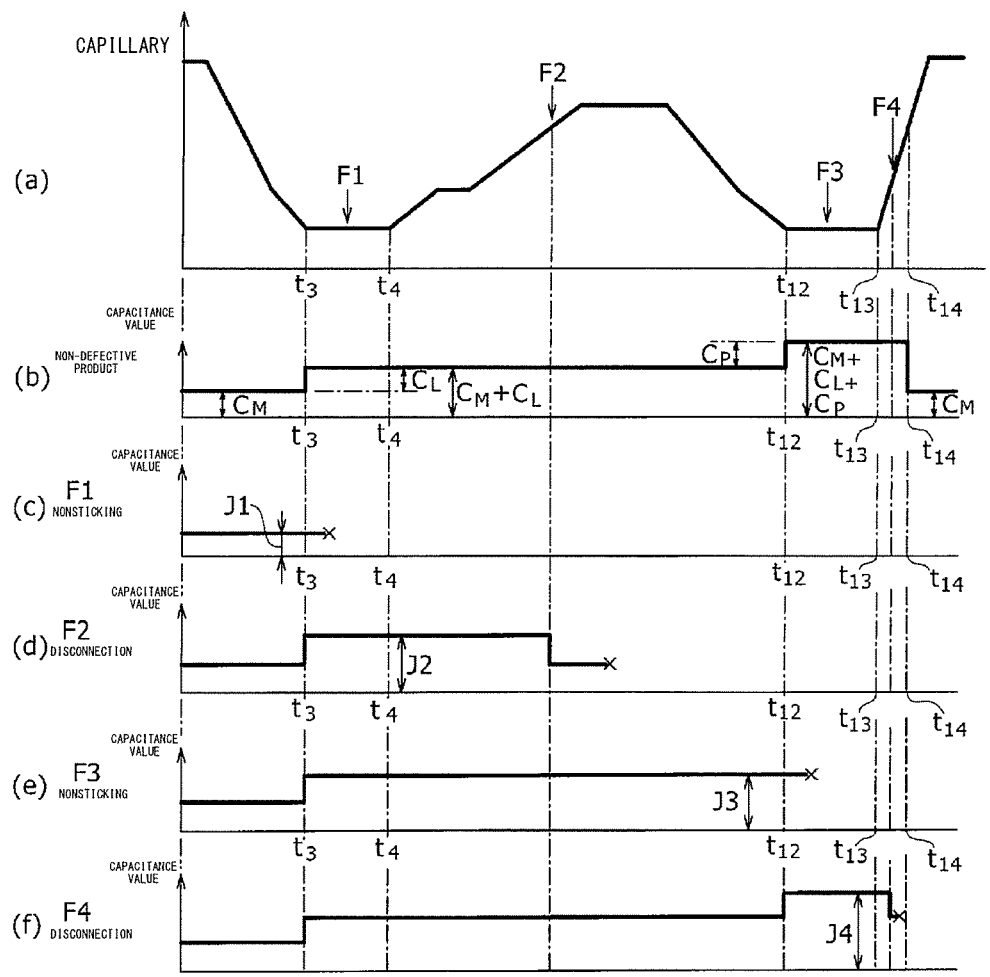
FIG. 11 is a chart showing a change in a capacitance value between the capillary and a bonding stage when nonsticking or premature disconnection of the wire occurs using an alternating-current electrical signal as a predetermined electrical signal in the wire-bonding apparatus according to the embodiment of the present invention.

FIG. 11 is a chart showing that F1 to F4 can be distinguished when an alternate voltage signal is used as the predetermined electrical signal, and the capacitance value between the wire 30 and the bonding stage 14 is measured as a continuous response of the signal. FIG. 11 is configured by six separate time chart from (a) to (f). A horizontal axis is time for all of these. A vertical axis indicates the height of the capillary for (a), and the capacitance value between the wire 30 and the bonding stage 14 for (b) to (f).

FIG. 11(a) corresponds to the chart at the top of FIG. 3. Time $t_3$, $t_4$, $t_{12}$, $t_{13}$, and $t_{14}$ in the horizontal axis are the same as those described with reference to FIG. 3. Specifically, the period from time $t_3$ to $t_4$ corresponds to the period for the first bonding operation, the period from $t_{12}$ to $t_{13}$ corresponds to the period for the second bonding operation, and $t_{14}$ corresponds to the timing at which the wire 30 is disconnected by the operation of the wire clamper 32 after the second bonding operation.

FIG. 11(b) is a time chart showing a temporal change in the capacitance value measured for a non-defective product to which all operation is performed without any problem over an entire period from the period before the first bonding operation to the period after the second bonding.

In FIG. 11(b), as the wire 30 is not brought into contact with the circuit board 8 before time $t_3$, the capacitance value is the apparatus capacitance value between the wire 30 and the bonding stage 14 via the wire-bonding apparatus 10. The apparatus capacitance value is indicated as $C_M$ in FIG. 11.

When the wire 30 is brought into contact with the circuit board 8 at time $t_3$, a value to which the capacitance value of the circuit board 8 is added is measured. The capacitance value of the circuit board 8 is indicated as $C_L$ in FIG. 11. Therefore, the measured value of the capacitance value during a period from time $t_3$ to time $t_{12}$ is $(C_M+C_L)$.

When the wire 30 is brought into contact with the chip 6 at time $t_{12}$, a value to which the capacitance value of the chip 6 is added is measured. The capacitance value of the chip 6 is indicated as $C_P$ in FIG. 11. Therefore, the measured value of the capacitance value during a period from time $t_{12}$ to time $t_{14}$ is $(C_M+C_L+C_P)$.

When the wire 30 is disconnected by the disconnecting operation at time $t_{14}$ and brought into the state shown in FIG. 10, the wire 30 is spaced apart from and not brought into contact with the chip 6 on the circuit board 8, and therefore the measured value of the capacitance value is again the apparatus capacitance value $C_M$.

FIG. 11(c) is a time chart showing a temporal change in the capacitance value when the nonsticking F1 occurs at the first bonding point. The nonsticking F1 occurs during the period between time $t_3$ and time $t_4$ corresponding to the period for the first bonding operation. When the nonsticking F1 occurs, the wire 30 is not fixedly connected to the circuit board 8, and therefore the capacitance value becomes smaller than the capacitance value $(C_M+C_L)$ at time $t_3$ for a non-defective product.

In order to distinguish between a non-defective product from the nonsticking F1, the capacitance value stably measured before $t_3$ can be used as a reference. For example, the capacitance value $C_M$ before $t_3$ is taken as a reference, and a value obtained by adding a previously determined measurement margin to $C_M$ is taken as a first reference value J1, and the first reference value J1 is used as a determination threshold for distinguishing a non-defective product from F1. In order to simplify the description, a relation is expressed by $J1=C_M$ in FIG. 11(c). It is determined to be a non-defective product when the measured capacitance value exceeds J1, and to be F1 when the measured capacitance value is no greater than J1. In one example of non-defective product, the measured capacitance value is $(C_M+C_L)$, and in one example of F1, the measured capacitance value remains $C_M$.

FIG. 11(d) is a time chart showing a temporal change in the capacitance value when the operation at the first bonding point is normally performed and the measured capacitance value becomes $(C_M+C_L)$ at time $t_3$, but the premature disconnection F2 of the wire 30 occurs in the loop forming operation. The premature disconnection F2 occurs between time $t_4$ and time $t_{12}$. As the wire 30 is spaced apart from the circuit board 8 when the premature disconnection F2 occurs, the measured capacitance value takes a value smaller than the capacitance value $(C_M+C_L)$ at time $t_4$ for a non-defective product.

In order to distinguish between a non-defective product from the premature disconnection F2, the capacitance value stably measured after $t_4$ can be used as a reference. For example, the capacitance value $(C_M+C_L)$ at $t_4$ is taken as a reference, and a value obtained by adding the previously determined measurement margin to $(C_M+C_L)$ is taken as a second reference value J2, and the second reference value J2 is used as a determination threshold for distinguishing a non-defective product from F2. In order to simplify the description, a relation is expressed by $J2=(C_M+C_L)$ in FIG. 11(d). It is determined to be a non-defective product when the measured capacitance value remains J2, and to be F2 when the measured capacitance value is smaller than J2. In one example of non-defective product, the measured capacitance value is $(C_M+C_L)$, and in one example of F2, the measured capacitance value is $C_M$.

FIG. 11(e) is a time chart showing a temporal change in the capacitance value when the nonsticking F3 occurs at the second bonding point even though the loop forming operation is normal. The nonsticking F3 occurs between time $t_{12}$ and time $t_{13}$. When the nonsticking F3 occurs, the wire 30 is not fixedly connected to the chip 6, and therefore the capacitance value becomes smaller than the capacitance value $(C_M+C_L+C_P)$ at time $t_{12}$ for a non-defective product.

In order to distinguish between a non-defective product from the nonsticking F3, the capacitance value stably measured $t_4$ can be used as a reference. For example, the capacitance value $(C_M+C_L)$ at $t_4$ is taken as a reference, and a value obtained by adding the previously determined measurement margin to $(C_M+C_L)$ is taken as a third reference value J3, and the third reference value J3 is used as a determination threshold for distinguishing a non-defective product from F3. In order to simplify the description, a relation is expressed by $J3=J2=(C_M+C_L)$ in FIG. 11(e). It is determined to be a non-defective product when the measured capacitance value exceeds J3, and to be F3 when the measured capacitance value remains J3. In one example of non-defective product, the measured capacitance value is $(C_M+C_L+C_P)$, and in one example of F3, the measured capacitance value is $(C_M+C_L)$.

FIG. 11(f) is a time chart showing a temporal change in the capacitance value when the operation at the second bonding point is normally performed and the measured capacitance value becomes $(C_M+C_L+C_P)$ at time $t_{12}$, but the premature disconnection F4 of the wire 30 occurs before the operation of disconnecting the wire. The premature disconnection F4 occurs between time $t_{13}$ and time $t_{14}$. As the wire 30 is spaced apart from the chip 6 when the premature disconnection F4 occurs, the measured capacitance value takes a value smaller than the capacitance value $(C_M+C_L+C_P)$ at time $t_{13}$ for a non-defective product.

In order to distinguish between a non-defective product from the premature disconnection F4, the capacitance value stably measured before $t_{13}$ can be used as a reference. For example, the capacitance value $(C_M+C_L+C_P)$ at $t_{13}$ is taken as a reference, and a value obtained by subtracting the previously determined measurement margin from $(C_M+C_L+C_P)$ is taken as a fourth reference value J4, and the fourth reference value J4 is used as a determination threshold for distinguishing a non-defective product from F4. In order to simplify the description, a relation is expressed by $J4=(C_M+C_L+C_P)$ in FIG. 11(f). It is determined to be a non-defective product when the measured capacitance value remains J4, and to be F4 when the measured capacitance value is smaller than J4. In one example of non-defective product, the measured capacitance value is $(C_M+C_L+C_P)$, and in one example of F4. The measured capacitance value is $(C_M+C_L)$.

As described above, by taking the first reference value J1 to the fourth reference value J4 as the determination references respectively corresponding to F1 to F4 using an alternate voltage signal as the predetermined electrical signal, it is possible to distinguish the nonsticking F1 at the first bonding point, the premature disconnection F2 in the loop forming operation, the nonsticking F3 at the second bonding point, and the premature disconnection F4 before the operation of disconnecting the wire.

Figure 12:
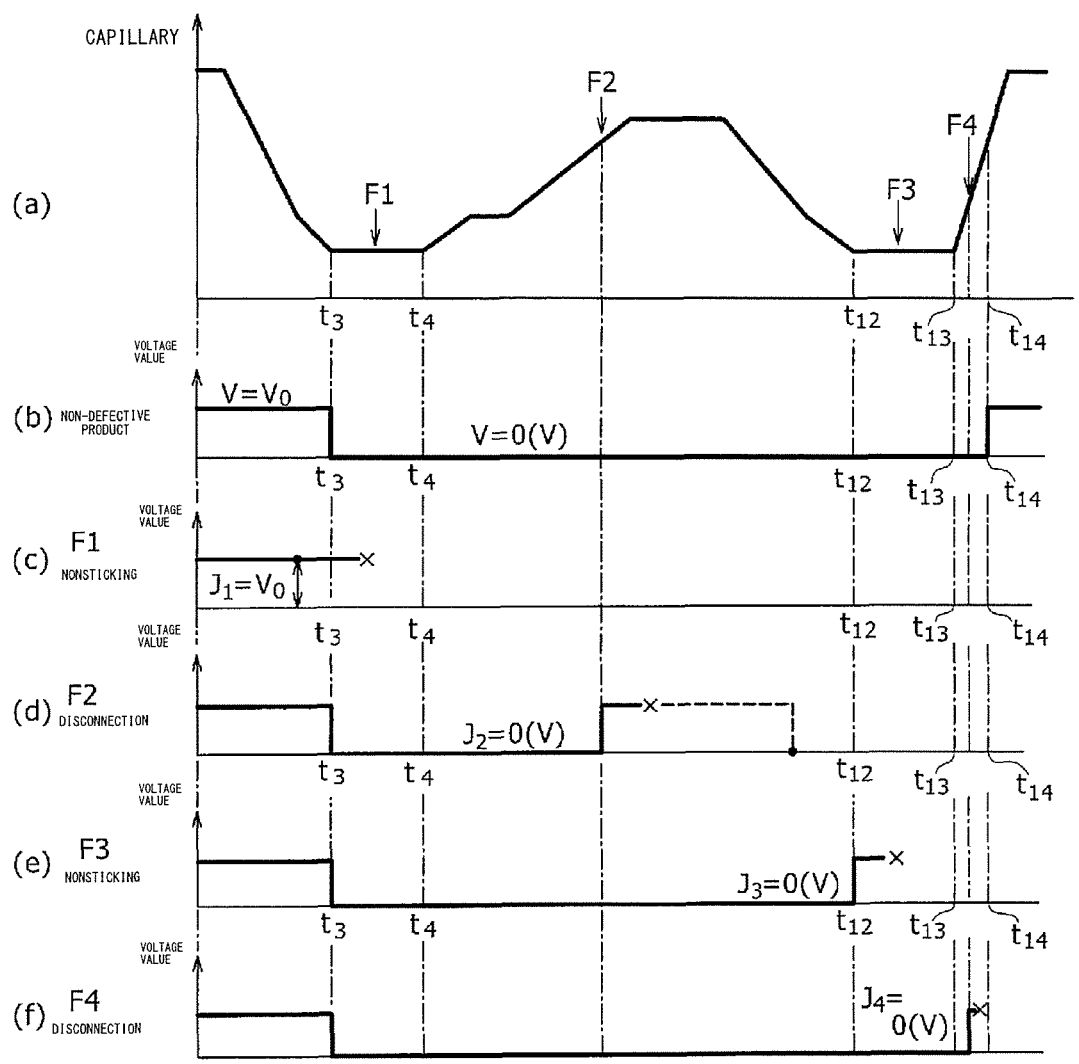
FIG. 12 is a chart showing a change in a voltage value between the capillary and a bonding stage when nonsticking or premature disconnection of the wire occurs using a direct voltage signal as a predetermined electrical signal in the wire-bonding apparatus according to the embodiment of the present invention.

FIG. 12 is a chart showing that F1 to F4 can be distinguished when a direct voltage signal is used as the predetermined electrical signal, and the voltage value between the wire 30 and the bonding stage 14 is measured as a continuous response of the signal. FIG. 12 corresponds to FIG. 11 and is configured by six separate time chart from (a) to (f). Similarly to FIG. 11, a horizontal axis is time for all of these. Further, a vertical axis indicates the height of the capillary for (a), and the voltage value between the wire 30 and the bonding stage 14 for (b) to (f).

Similarly to FIG. 11(a), FIG. 12(a) corresponds to the chart at the top of FIG. 3. Time $t_3$, $t_4$, $t_{12}$, $t_{13}$, and $t_{14}$ in the horizontal axis are not described in further detail, as having been described with reference to FIG. 3, similarly to FIG. 11.

In FIG. 12(b) is a time chart showing a temporal change in the voltage value measured for a non-defective product to which all operation is performed without any problem over an entire period from the period before the first bonding operation to the period after the second bonding.

In FIG. 12(b), as the wire 30 is not brought into contact with the circuit board 8 before time $t_3$, there is no electric short circuit between the wire 30 and the bonding stage 14, and the measured voltage value is the predetermined voltage value $V_0$.

When the wire 30 is brought into contact with the circuit board 8 at time $t_3$, an electric short circuit is produced between the bonding stage 14 and the wire 30 via the circuit board 8. With this, the measured voltage value becomes V=0 (V).

When the wire 30 is brought into contact with the chip 6 at time $t_{12}$, the bonding stage 14 and the wire 30 remains in an electrically short circuit condition via the chip 6 and the circuit board 8, and the measured voltage value remains V=0 (V). When the wire 30 is disconnected by the disconnection operation at time $t_{14}$ and brought into the state shown in FIG. 10, the wire 30 is spaced apart from and not brought into contact with the chip 6 on the circuit board 8. Therefore there is no electric short circuit between the wire 30 and the bonding stage 14, and the measured voltage value is again the predetermined voltage value $V_j$.

In this manner, when a direct voltage signal is used as the predetermined electrical signal, a voltage value from time $t_3$ to $t_{14}$ is V=0 (V) for a non-defective product.

FIG. 12(c) is a time chart showing a temporal change in the voltage value when the nonsticking F1 occurs at the first bonding point. The nonsticking F1 occurs during the period between time $t_3$ and time $t_4$ corresponding to the period for the first bonding operation. When the nonsticking F1 occurs, the wire 30 is not fixedly connected to the circuit board 8, and therefore there is no electric short circuit between the wire 30 and the bonding stage 14. Therefore, the voltage value remains the predetermined voltage value $V_0$, which is a voltage value at time $t_3$ for a non-defective product.

In order to distinguish between a non-defective product from the nonsticking F1, the voltage value stably measured before $t_3$ can be used as a reference. For example, the predetermined voltage value $V_0$ which is a voltage value before $t_3$ is taken as a reference, and a value obtained by adding a previously determined measurement margin to $V_0$ is taken as a first reference value J1, and the first reference value J1 is used as a determination threshold for distinguishing a non-defective product from F1. In order to simplify the description, a relation is expressed by J1=$V_o$ in FIG. 12(c). It is determined to be a non-defective product when the measured voltage value is smaller than J1, and to be F1 when the measured capacitance value remains J1. In one example of non-defective product, the measured voltage value is V=0 (V), and in one example of F1, the measured voltage value remains $V_0$.

FIG. 12(d) is a time chart showing a temporal change in the voltage value when the operation at the first bonding point is normally performed and the measured voltage value becomes V=0 (V) at time $t_3$, but the premature disconnection F2 of the wire 30 occurs in the loop forming operation. The premature disconnection F2 occurs between time $t_4$ and time $t_{12}$. As the wire 30 is spaced apart from the circuit board 8 when the premature disconnection F2 occurs, there is no electric short circuit between the wire 30 and the bonding stage 14, and the measured voltage value takes a value greater than the voltage value V=0 (V) at time $t_4$ for a non-defective product.

In order to distinguish between a non-defective product from the premature disconnection F2, the voltage value stably measured after $t_4$ can be used as a reference. For example, the voltage value V=0 (V) at $t_4$ is taken as a reference, and a value obtained by adding the previously determined measurement margin to V=0 (V) is taken as a second reference value J2, and the second reference value J2 is used as a determination threshold for distinguishing a non-defective product from F2. In order to simplify the description, a relation is expressed by J2=0 (V) in FIG. 12(d). It is determined to be a non-defective product when the measured voltage value remains J2, and to be F2 when the measured voltage value exceeds J2. In one example of non-defective product, the measured voltage value is V=0 (V), and in one example of F2, the measured voltage value is $V_0$.

FIG. 12(e) is a time chart showing a temporal change in the voltage value when the nonsticking F3 occurs at the second bonding point even though the loop forming operation is normal. The nonsticking F3 occurs between time $t_{12}$ and time $t_{13}$. When the nonsticking F3 occurs, the wire 30 is not fixedly connected to the chip 6, and therefore there is no electric short circuit between the wire 30 and the bonding stage 14. Therefore, the voltage value becomes the predetermined voltage value $V_0$.

In order to distinguish between a non-defective product from the nonsticking F3, the voltage value stably measured $t_4$ can be used as a reference. For example, the voltage value V=0 (V) at $t_4$ is taken as a reference, and a value obtained by adding the previously determined measurement margin to V=0 (V) is taken as a third reference value J3, and the third reference value J3 is used as a determination threshold for distinguishing a non-defective product from F3. In order to simplify the description, a relation is expressed by J3=J2=0 (V) in FIG. 12(e). It is determined to be a non-defective product when the measured voltage value remains J3, and to be F3 when the measured voltage value exceeds J3. In one example of non-defective product, the measured voltage value is V=0 (V), and in one example of F3, the measured voltage value is $V_0$.

FIG. 12(f) is a time chart showing a temporal change in the voltage value when the operation at the second bonding point is normally performed and the measured voltage value remains V=0 (V) at time $t_{12}$, but the premature disconnection F4 of the wire 30 occurs before the operation of disconnecting the wire. The premature disconnection F4 occurs between time $t_{13}$ and time $t_{14}$. As the wire 30 is spaced apart from the chip 6 when the premature disconnection F4 occurs, there is no electric short circuit between the wire 30 and the bonding stage 14. The measured voltage value takes a value greater than the voltage value V=0 (V) at time $t_{13}$ for a non-defective product.

In order to distinguish between a non-defective product from the premature disconnection F4, the voltage value stably measured before $t_{13}$ can be used as a reference. For example, the voltage value V=0 (V) at $t_{13}$ is taken as a reference, and a value obtained by subtracting the previously determined measurement margin from V=0 (V) is taken as a fourth reference value J4, and the fourth reference value J4 is used as a determination threshold for distinguishing a non-defective product from F4. In order to simplify the description, a relation is expressed by J4=J3=J2=0 (V) in FIG. 12(f). It is determined to be a non-defective product when the measured voltage value remains J4, and to be F4 when the measured voltage value exceeds J4. In one example of non-defective product, the measured voltage value is V=0 (V), and in one example of F4. The measured voltage value is $V_0$.

As described above, by taking the first reference value J1 to the fourth reference value J4 as the determination references respectively corresponding to F1 to F4 using a direct voltage signal as the predetermined electrical signal, it is possible to distinguish the nonsticking F1 at the first bonding point, the premature disconnection F2 in the loop forming operation, the nonsticking F3 at the second bonding point, and the premature disconnection F4 before the operation of disconnecting the wire. In particular, as the relation can be J2=J3=J4=0 (V), the measurement and the determination can be facilitated.

In the above description, the wire bonding at the first bonding point and the second bonding point is described to be performed according to the wedge bonding method using a capillary. However, the wire bonding can be performed according to a ball bonding method.

The present invention is not limited to the embodiment described above, and includes any modifications and alterations without departing from the technical scope and the spirit of the present invention defined by the appended claims.

INDUSTRIAL APPLICABILITY

The present invention can be applied to an apparatus and a wire bonding method, both for performing wire bonding using a capillary.

What is claimed is:

1. A wire bonding method comprising:
a first bonding step of bonding a wire to a bonding target at a first bonding point of wire bonding;
a continuous monitoring step of continuously applying a predetermined electrical signal between the wire held by a capillary and the bonding target to obtain a change in a capacitance value between the wire held by the capillary and the bonding target, the continuous monitoring step being performed after the first bonding step and during a period in which the wire is fed from the first bonding point to a second bonding point for the wire bonding in a second bonding step; and
a premature disconnection determination step of determining that the wire is prematurely disconnected when the capacitance value decreases after the first bonding step, and of determining that the wire that has been prematurely disconnected drops down and is brought into contact with the bonding target when the capacitance value returns before the second bonding point.

2. The wire bonding method according to claim 1, wherein
the predetermined electrical signal is an alternating-current electrical signal.

3. The wire bonding method according to claim 1, wherein
the predetermined electrical signal is a direct-current pulsed signal.

4. A wire-bonding apparatus comprising:
a first bonding unit configured to bond a wire to a first bonding target at a first bonding point of wire bonding in a first bonding operation;
a loop forming unit configured to move the wire from the first bonding point to a second bonding point while the wire is fed to form a predetermined loop;
a second bonding unit configured to bond the wire to a second bonding target at the second bonding point in a second bonding operation; and
a nonsticking monitoring unit configured to monitor a connecting state of the wire and determine whether or not the connecting state changes, the monitoring and the determination being made based on a continuous response to a continuous application of a predetermined electrical signal between the wire held by a capillary and a bonding stage for supporting the first bonding target and the second bonding target, the predetermined electrical signal being the same over an entire period from a period before the first bonding operation to a period after the second bonding operation, wherein
the nonsticking monitoring unit:
monitors the connecting state of the wire and determines whether or not the connecting state changes, based on one of a change in a capacitance value and a presence of an electrically short circuit between the wire and the bonding stage,
determines, taking a stable value of the continuous response during the period before the first bonding operation as a first reference value, that the connecting state between the wire and the first bonding target is defective when a value of the continuous response at the first bonding point remains the first reference value, and that the connecting state between the wire and the first bonding target is non-defective when the value of the continuous response at the first bonding point is different from the first reference value,
determines, taking a stable value of the continuous response when the first bonding operation is completed as a second reference value, that the connecting state of the wire is defective when a value of the continuous response during the loop forming operation is different from the second reference value, and that the connecting state of the wire is non-defective when the value of the continuous response during the loop forming operation is the same as the second reference value,
determines, taking a stable value of the continuous response during the loop forming operation as a third reference value, that the connecting state between the wire and the second bonding target is defective when a value of the continuous response at the second bonding point is the same as the third reference value, and that the connecting state between the wire and the second bonding target is non-defective when the value of the continuous response at the second bonding point is different from the third reference value, and
determines, taking a stable value of the continuous response when the second bonding operation is completed as a fourth reference value, that the connecting state of the wire is defective when a value of the continuous response during a period from the second bonding point to a point at which disconnection of the wire is completed is different from the fourth reference value, and that the connecting state of the wire is non-defective when the value of the continuous response during the period from the second bonding point to the point at which disconnection of the wire is completed is the same as the fourth reference value.

5. The wire-bonding apparatus according to claim 4, wherein the nonsticking monitoring unit determines whether or not the connecting state of the wire changes, by applying a direct voltage signal to the wire as the predetermined electrical signal, the direct voltage signal having a voltage different from a ground voltage value by a predetermined voltage value, the ground voltage value being a potential of the bonding stage, the predetermined voltage value being taken as the first reference value, the ground voltage value being taken as each of the second to the fourth reference value.

6. The wire-bonding apparatus according to claim 4, wherein the wire bonding respectively at the first bonding point and the second bonding point is performed according to one of a wedge bonding method and a ball bonding method.

7. A wire bonding method comprising:

a first bonding step of bonding a wire to a first bonding target at a first bonding point of wire bonding;

a loop formation step of moving the wire from the first bonding point to a second bonding point while the wire is fed to form a predetermined loop;

a second bonding step of bonding the wire to a second bonding target at the second bonding point; and a nonsticking monitoring step of monitoring a connecting state of the wire and determining whether or not the connecting state changes, the monitoring and the determination being made based on a continuous response to a continuous application of a predetermined electrical signal between the wire held by a capillary and a bonding stage for supporting the first bonding target and the second bonding target over an entire period from a period before the first bonding step to a period after the second bonding step, the predetermined electrical signal being the same over the entire period from the period before the first bonding step to the period after the second bonding, wherein the nonsticking monitoring step is a step of monitoring the connecting state of the wire and determining whether or not the connecting state changes, based on one of a change in a capacitance value and a presence of an electrically short circuit between the wire and the bonding stage, and the nonsticking monitoring step comprises:

taking a stable value of the continuous response during the period before the first bonding step as a first reference value, the connecting state between the wire and the first bonding target is determined to be defective when a value of the continuous response at the first bonding point remains the first reference value, and the connecting state between the wire and the first bonding target is determined to be non-defective when the value of the continuous response at the first bonding point is different from the first reference value;

taking a stable value of the continuous response when the first bonding step is completed as a second reference value, the connecting state of the wire is determined to be defective when a value of the continuous response during the loop forming step is different from the second reference value, and the connecting state of the wire is determined to be non-defective when the value of the continuous response during the loop forming step is the same as the second reference value;

taking a stable value of the continuous response during the loop forming step as a third reference value, the connecting state between the wire and the second bonding target is determined to be defective when a value of the continuous response at the second bonding point is the same as the third reference value, and the connecting state between the wire and the second bonding target is determined to be non-defective when the value of the continuous response at the second bonding point is different from the third reference value; and taking a stable value of the continuous response when the second bonding step is completed as a fourth reference value, the connecting state of the wire is determined to be defective when a value of the continuous response during a period from the second bonding point to a point at which a disconnection of the wire is completed is different from the fourth reference value, and the connecting state of the wire is determined to be non-defective when the value of the continuous response during the period from the second bonding point to the point at which the disconnection of the wire is completed is the same as the fourth reference value.

8. The wire bonding method according to claim 1, wherein the premature disconnection determination step of determining that the capacitance value has decreased or returned to the original value based on a differential value obtained by differentiating the obtained capacitance values with respect to time.

9. The wire bonding method according to claim 1, wherein the first bonding step of bonding wire at the first bonding point is performed according to a wedge bonding method.

* * * * *